(12) United States Patent
Akeboshi et al.

(10) Patent No.: US 8,594,591 B2
(45) Date of Patent: Nov. 26, 2013

(54) TRANSMISSION SYSTEM

(75) Inventors: Yoshihiro Akeboshi, Tokyo (JP);
Hideyuki Ohashi, Tokyo (JP); Tetsuro Komura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/514,008

(22) PCT Filed: Dec. 17, 2009

(86) PCT No.: PCT/JP2009/071027
§ 371 (c)(1),
(2), (4) Date: Jun. 5, 2012

(87) PCT Pub. No.: WO2011/074094
PCT Pub. Date: Jun. 23, 2011

(65) Prior Publication Data
US 2012/0249209 A1 Oct. 4, 2012

(51) Int. Cl.
*H04B 15/00* (2006.01)
(52) U.S. Cl.
USPC ..................................... 455/114.2; 455/127.2
(58) Field of Classification Search
None
See application file for complete search history.

(56) References Cited

U.S. PATENT DOCUMENTS 5,986,799 A * 11/1999 Itou et al. .................... 359/337
7,127,219 B2 * 10/2006 Nitta ............................ 455/126

FOREIGN PATENT DOCUMENTS

| JP | 1 149558 | 6/1989 |
|---|---|---|
| JP | 6 13249 | 2/1994 |
| JP | 2002 209193 | 7/2002 |
| JP | 3730080 | 12/2005 |

OTHER PUBLICATIONS

International Search Report Issued Jan. 26, 2010 in PCT/JP09/71027 Filed Dec. 17, 2009.

* cited by examiner

*Primary Examiner* — An Luu
(74) *Attorney, Agent, or Firm* — Oblon, Spivak, McClelland, Maier & Neustadt, L.L.P.

(57) ABSTRACT

Provided is a transmission system capable of improving the SN ratio for noise superimposed on a transmission line and extending the dynamic range. The transmission system transmits a signal between a transmitter (1) and a receiver (3), which are connected to each other via a transmission line (2). The transmitter (1) includes a transmission amplifier (11) for stepping up an amplitude of an input signal. The receiver (3) includes: an amplitude comparison circuit (31) for attenuating the amplitude of the signal, which is output from the transmission amplifier (11) and input via the transmission line (2), and comparing the attenuated amplitude and a reference voltage; a variable attenuation circuit (32) for outputting, when the attenuated amplitude is larger than the reference voltage, the signal input to the receiver (3) after attenuating the amplitude of the signal, and for outputting, when the attenuated amplitude is smaller than the reference voltage, the signal input to the receiver (3) without attenuating the amplitude of the signal; and an amplitude limiting circuit (33) for clipping the amplitude of the signal output from the variable attenuation circuit (32) at a threshold voltage.

3 Claims, 8 Drawing Sheets

TRANSMISSION SYSTEM

TECHNICAL FIELD

The present invention relates to a transmission system for transmitting a signal between a transmitter and a receiver connected to each other via a transmission line.

BACKGROUND ART

Conventionally, a transmission system which can transmit a signal inexpensively at high speed in a severe noise environment such as in a railroad car is needed.

As the transmission system of this type, there is known a transmission system for railroad, which builds a general-purpose local area network (LAN) over a plurality of railroad cars, and transmits video data and control data between the railroad cars (see Patent Literature 1, for example).

The transmission system for railroad described in Patent Literature 1 is described below referring to FIG. 7. FIG. 7 is a configuration diagram illustrating the conventional transmission system for railroad.

In FIG. 7, a LAN hub 51 is provided on each of a plurality of railroad cars 50 coupled with each other. Moreover, a vehicle information central device 52 and an operator seat screen device 53 are provided on each of both of lead cars 50.

The LAN hubs 51, the vehicle information central devices 52, and the operator seat screen devices 53 are connected with one another via a LAN main line 54. Moreover, the LAN main line 54 is connected by crossovers 55 between the railroad cars 50. A signal can be transmitted inexpensively at high speed by applying the general-purpose LAN to the transmission system for railroad.

However, when a signal is transmitted between the railroad cars 50, the signal is transmitted via the crossover 55, and hence there is a problem that transmission characteristics are degraded by a transmission loss of the transmission line, characteristics of the crossover 55, noise superimposed on the crossover 55, and the like.

Now, a general method for restraining a degradation of the transmission characteristics in a transmission system is described referring to FIG. 8. FIG. 8 is a configuration diagram illustrating a general transmission system which can restrain the degradation of the transmission characteristics.

In FIG. 8, the transmission system includes a transmitter 61, and a receiver 63 connected to the transmitter 61 via a transmission line 62.

The transmitter 61 includes a transmission amplifier 64 for stepping up a signal amplitude of an input signal with a gain G. The receiver 63 includes an attenuation circuit 65 for attenuating a signal amplitude of an input signal by G times.

In other words, a signal voltage $V_o$ of the transmission signal is stepped up to $GV_o$ by the transmission amplifier 64, and is output to the transmission line 62 as an output signal having the signal amplitude $GV_o$. Moreover, the output signal transmitted over the transmission line 62 is input to the receiver 63 as an input signal having a signal amplitude $V_{in}$. The signal amplitude $V_{in}$ of the input signal is attenuated by the attenuation circuit 65 by G times into a received signal having a signal amplitude $V_{rcv}$.

According to this transmission system, the signal amplitude $V_o$ of the transmission signal is stepped up by G times, and the SN ratio for noise superimposed on the transmission line 62 is thus improved by G times at most. Therefore, the degradation of the transmission characteristics can be restrained.

CITATION LIST

Patent Literature

[PTL 1] JP 2001-275211 A

SUMMARY OF INVENTION

Technical Problem

However, the conventional technology has the following problems.

In the general transmission system illustrated in FIG. 8, the attenuation circuit 65 uniformly attenuates the signal amplitude $V_{in}$ of the input signal input to the receiver 63 by G times. Therefore, if a transmission loss of the transmission line 62 is large, the signal amplitude $V_{rcv}$ of the received signal attenuated by the attenuation circuit 65 becomes less than the minimum voltage level that enables communication, and there poses a problem that the signal cannot be received. In other words, there is a problem that a dynamic range for enabling communication becomes narrower.

The present invention has been made to solve the above-mentioned problems and has an object of obtaining a transmission system capable of improving the SN ratio for noise superimposed on a transmission line and extending the dynamic range.

Solution to Problem

According to the present invention, there is provided a transmission system for transmitting a signal between a transmitter and a receiver, which are connected to each other via a transmission line, in which: the transmitter includes an amplification circuit for stepping up an amplitude of an input signal; and the receiver includes: an amplitude comparison circuit for attenuating the amplitude of the signal, which is output from the amplification circuit and input via the transmission line, and comparing the attenuated amplitude and a reference voltage; a variable attenuation circuit for outputting, when the attenuated amplitude is larger than the reference voltage, the signal input to the receiver after attenuating the amplitude of the signal, and for outputting, when the attenuated amplitude is smaller than the reference voltage, the signal input to the receiver without attenuating the amplitude of the signal; and an amplitude limiting circuit for clipping the amplitude of the signal output from the variable attenuation circuit at a threshold voltage.

Advantageous Effects of Invention

According to the transmission system of the present invention, when the amplitude attenuated by the amplitude comparison circuit is larger than the reference voltage, the variable attenuation circuit outputs the signal input to the receiver after attenuating the amplitude of the signal, and when the attenuated amplitude is smaller than the reference voltage, the variable attenuation circuit outputs the signal input to the receiver without attenuating the amplitude of the signal. Moreover, the amplitude limiting circuit clips the amplitude of the signal output from the variable attenuation circuit at the threshold voltage.

In other words, if the transmission loss of the transmission line is small, the variable attenuation circuit is activated, thereby improving the SN ratio for the noise superimposed on the transmission line, and if the transmission loss of the transmission line is large, the variable attenuation circuit is deactivated, thereby extending the dynamic range for enabling communication.

Therefore, a transmission system which is capable of improving the SN ratio for the noise superimposed on the transmission line and extending the dynamic range can be obtained.

DESCRIPTION OF EMBODIMENTS

Figure 1:
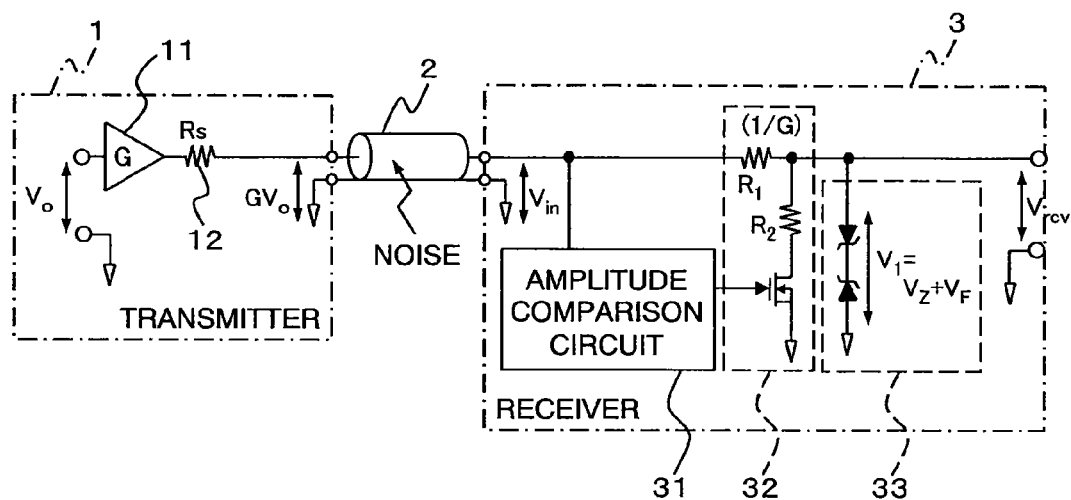
FIG. 1 A configuration diagram illustrating a transmission system according to a first embodiment of the present invention.

Now, radar devices according to preferred embodiments of the present invention are described referring to the drawings, and like or corresponding components are denoted by like symbols throughout the drawings.

Embodiment 1

FIG. 1 is a configuration diagram illustrating a transmission system according to a first embodiment of the present invention.

In FIG. 1, the transmission system includes a transmitter 1, and a receiver 3 connected to the transmitter 1 via a transmission line 2.

The transmitter 1 includes a transmission amplifier (amplification circuit) 11 which steps up a signal amplitude of an input signal with a gain G, and an output resistor 12 serially connected to an output of the transmission amplifier 11. In the first embodiment, G is 4 and a resistance Rs of the output resistor 12 is 50Ω, for example.

Specifically, a signal amplitude $V_o$ of the transmission signal generated by the transmitter 1 is stepped up to $GV_o$ by the transmission amplifier 11, and is output to the transmission line 2 as an output signal having the signal amplitude $GV_o$. Moreover, the output signal transmitted over the transmission line 2 is input to the receiver 3 as an input signal having a signal amplitude $V_{in}$.

The receiver 3 includes an amplitude comparison circuit 31, a variable attenuation circuit 32, and an amplitude limiting circuit 33.

The amplitude comparison circuit 31 attenuates the signal amplitude $V_{in}$ of the input signal, which is output from the transmission amplifier 11 and input via the transmission line 2, by G times, and compares the attenuated signal amplitude $V_{in}/G$ and a reference voltage $V_{ref}$ with each other.

Figure 2:
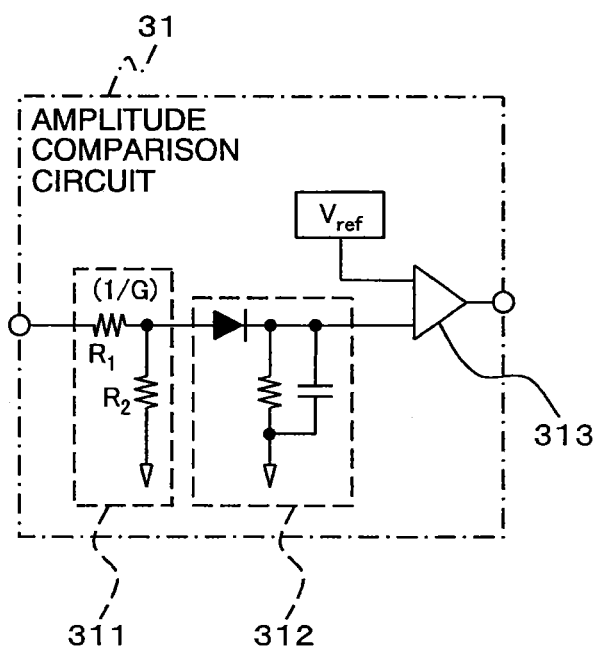
FIG. 2 A circuit diagram exemplifying a specific configuration of an amplitude comparison circuit according to the first embodiment of the present invention.

FIG. 2 is a circuit diagram exemplifying a specific configuration of the amplitude comparison circuit 31 according to the first embodiment of the present invention.

In FIG. 2, the amplitude comparison circuit 31 includes an attenuation circuit 311, a rectification circuit 312, and a comparison circuit 313.

The attenuation circuit 311 attenuates the signal amplitude $V_{in}$ of the input signal, which has been input, by G times. The attenuation circuit 311 includes two resistors which are connected respectively in serial and in parallel to the input. In the first embodiment, considering the input impedance of 50Ω, the respective resistances R1 and R2 are 37.5Ω and 12.5Ω. In other words, the signal amplitude $V_{in}$ of the input signal is attenuated by 4 times.

The rectification circuit 312 rectifies the attenuated input signal output from the attenuation circuit 311, and outputs a rectified signal. The comparison circuit 311 compares the signal amplitude $V_{in}/G$ of the attenuated and rectified input signal output from the rectification circuit 312, and the reference voltage $V_{ref}$ with each other. When the signal amplitude $V_{in}/G$ is larger than the reference voltage $V_{ref}$, the comparison circuit 313 outputs Hi, and when the signal amplitude $V_{in}/G$ is smaller than the reference voltage $V_{ref}$, the comparison circuit 313 outputs Low.

Figure 3:
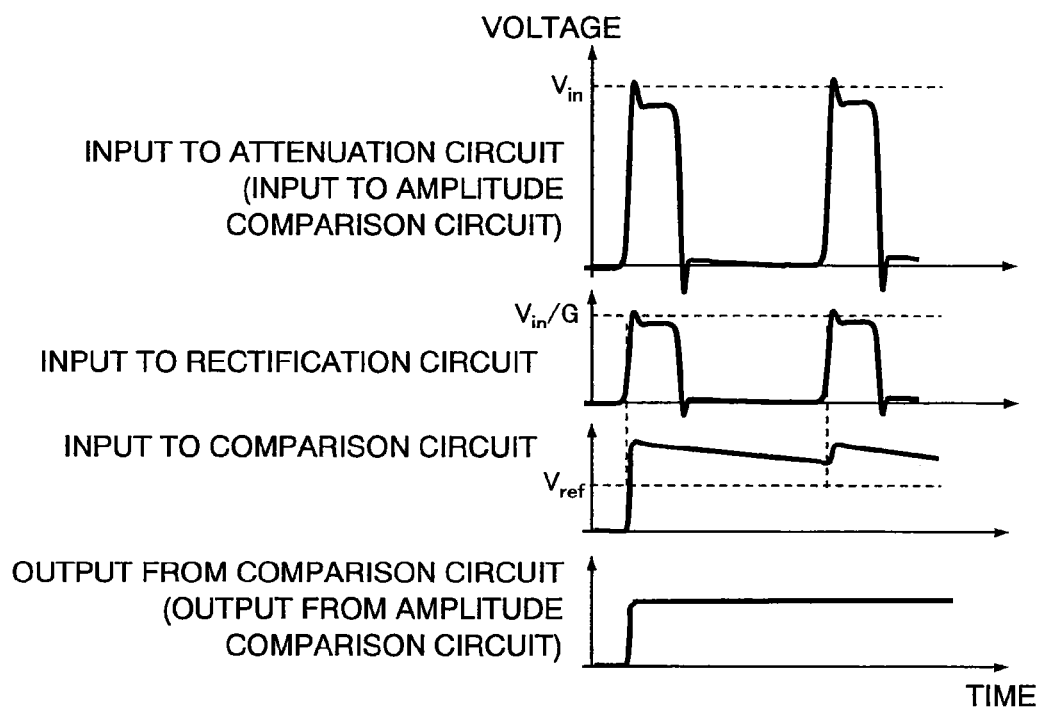
FIG. 3 A timing chart illustrating voltage waveforms at respective parts of the amplitude comparison circuit according to the first embodiment of the present invention.

FIG. 3 is a timing chart illustrating voltage waveforms at respective parts of the amplitude comparison circuit 31 according to the first embodiment of the present invention. The vertical axes of FIG. 3 represent the input to the attenuation circuit 311, the input to the rectification circuit 312, the input to the comparison circuit 313, and the output from the comparison circuit 313. Moreover, FIG. 3 illustrates waveforms exhibited when the signal amplitude $V_{in}/G$ of the attenuated input signal is larger than the reference voltage $V_{ref}$.

In FIG. 3, when the signal amplitude $V_{in}/G$ is larger than the reference voltage $V_{ref}$, the comparison circuit 313 outputs Hi, and brings an FET (to be described later) of the variable attenuation circuit 32 into the on state.

When the amplitude comparison circuit 31 determines that the signal amplitude $V_{in}/G$ is larger than the reference voltage $V_{ref}$, the variable attenuation circuit 32 attenuates the signal amplitude $V_{in}$ of the input signal by G times, and outputs the attenuated input signal. If the amplitude comparison circuit 31 determines that the signal amplitude $V_{in}/G$ is smaller than the reference voltage $V_{ref}$, the variable attenuation circuit 32 outputs the input signal without attenuating the signal amplitude $V_{in}$.

The variable attenuation circuit 32 includes two resistors which are connected respectively in serial and in parallel to the input, and the field effect transistor (FET) which is connected in parallel to the input. In the first embodiment, considering the input impedance of 50Ω, the respective resistances R1 and R2 are 37.5Ω and 12.5Ω. Moreover, on/off of the FET is controlled by the amplitude comparison circuit 31.

In other words, when the amplitude comparison circuit 31 outputs Hi, the FET is brought into the on state, and, with the input impedance of 50Ω, the signal amplitude $V_{in}$ of the input signal is attenuated by 4 times and output. Moreover, when the amplitude comparison circuit 31 outputs Low, the FET is brought into the off state, and the input signal is output without the signal amplitude $V_{in}$ being attenuated.

The amplitude limiting circuit 33 is connected in parallel to the output of the variable attenuation circuit 32, and clips the signal amplitude ($V_{in}/G$ or $V_{in}$) of the signal output from the variable attenuation circuit 32 at a predetermined threshold voltage $V_1$.

The amplitude limiting circuit 33 includes two Zener diodes in a back-to-back configuration. On this occasion, the threshold voltage $V_1$ at which the signal amplitude is clipped is $V_1 = V_z + V_f$, where $V_z$ is the Zener voltage of the Zener diode and $V_f$ is the forward voltage drop.

With the amplitude limiting circuit 33 provided, it is guaranteed that a signal amplitude $V_{rcv}$ of the received signal is equal to or less than the threshold voltage $V_1$, thereby preventing an excessive input of the signal on a reception terminal.

It should be noted that the threshold voltage $V_1$ is set to a value slightly higher than a minimum voltage level $V_{TH}$ that enables the communication on a reception part. Moreover, the threshold voltage $V_1$ is set to the same value within a margin of error as the reference voltage $V_{ref}$ in the amplitude comparison circuit 31.

Figure 4:
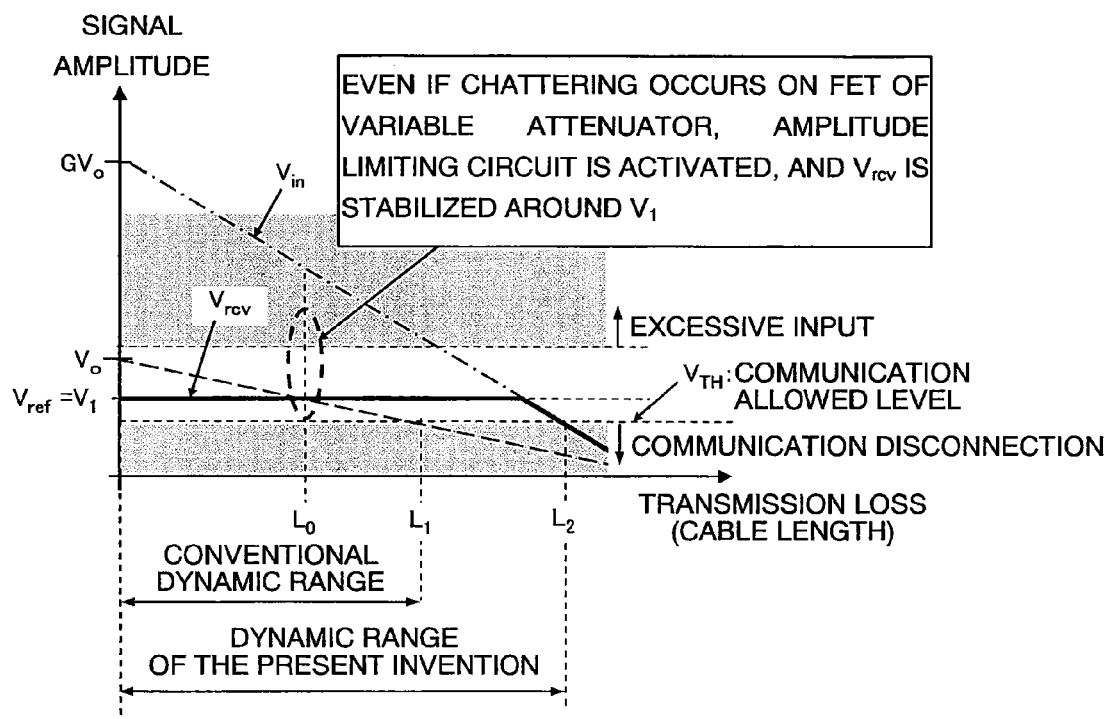
FIG. 4 An explanatory diagram illustrating a signal amplitude of a received signal in the transmission system according to the first embodiment of the present invention.

FIG. 4 is an explanatory diagram illustrating the signal amplitude $V_{rcv}$ of the received signal in the transmission system according to the first embodiment of the present invention. The vertical axis of FIG. 4 represents the signal amplitude (voltage), and the horizontal axis represents the transmission loss (cable length).

In FIG. 4, a broken line represents the signal amplitude $V_o$ of the transmission signal; a dot and dash line, the signal amplitude $V_{in}$ of the input signal; and a solid line, the signal amplitude $V_{rcv}$ of the received signal. Moreover, $V_{TH}$ represents the minimum voltage level that enables the communication in the reception part, and a voltage equal to or less than this voltage cannot be received. Moreover, the reference voltage $V_{ref}$ in the amplitude comparison circuit 31 and the threshold voltage $V_1$ in the amplitude limiting circuit 33 are set to a value slightly higher than $V_{TH}$.

Figure 8:
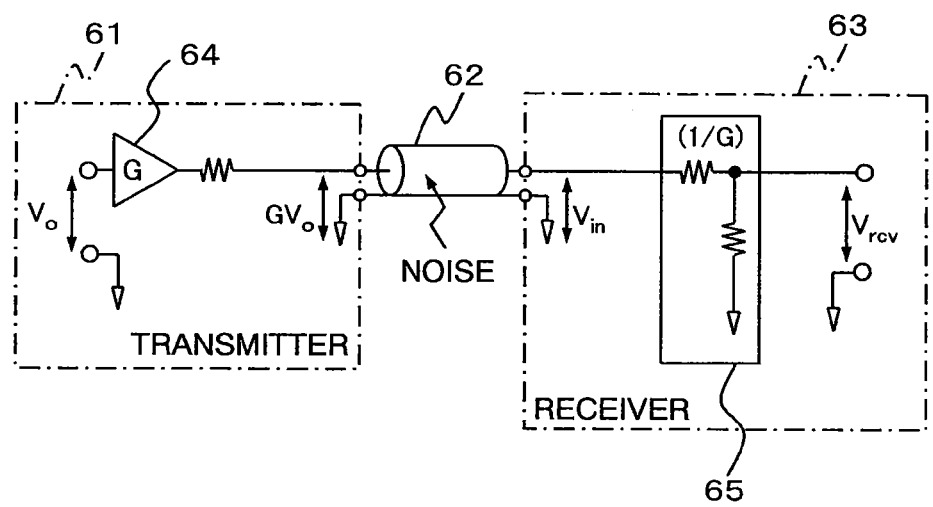
FIG. 8 A configuration diagram illustrating a general transmission system which can improve transmission characteristics.

In the above-mentioned general transmission system (see FIG. 8), which can restrain the transmission characteristics from degrading, the signal amplitude $V_{in}$ of the input signal is uniformly attenuated by G times, resulting in the signal amplitude represented by the broken line of FIG. 4. Therefore, the signal amplitude $V_{rcv}$ is equal to or less than $V_{TH}$ in a state in which the transmission loss is $L_1$, and cannot be received. Therefore, the dynamic range is limited to an extent equal to or less than $L_1$.

In contrast, in the transmission system according to the first embodiment of the present invention, when the amplitude comparison circuit 31 determines that the signal amplitude $V_{in}/G$ is smaller than the reference voltage $V_{ref}$ (the state in which the transmission loss is $L_0$), the FET of the variable attenuation circuit 32 is brought into the off state, and the maximum value of the signal amplitude $V_{rcv}$ of the received signal is clipped at the threshold voltage $V_1$ ($=V_{ref}$) by the amplitude limiting circuit 33. As a result, in the transmission system according to the first embodiment of the present invention, the dynamic range is extended to a state in which the transmission loss is $L_2$, at which the signal amplitude $V_{rcv}$ of the received signal finally decreases to a value equal to or less than $V_{TH}$.

Moreover, in the transmission system according to the first embodiment of the present invention, the reference voltage $V_{ref}$ in the amplitude comparison circuit 31 and the threshold voltage $V_1$ in the amplitude limiting circuit 33 are set to the same value within a margin of error. As a result, even if chattering which turns on/off the FET of the variable attenuation circuit 32 is generated in a neighborhood at the transmission loss of $L_0$, the amplitude limiting circuit 33 is activated, and the signal amplitude $V_{rcv}$ of the received signal is set to a voltage equal to or less than the threshold voltage $V_1$. Thus, no waveform variation occurs in the received signal.

As described above, according to the first embodiment, when the amplitude attenuated by the amplitude comparison circuit is larger than the reference voltage, the variable attenuation circuit outputs the signal input to the receiver after attenuating the amplitude of the signal, and when the attenuated amplitude is smaller than the reference voltage, the variable attenuation circuit outputs the signal input to the receiver without attenuating the amplitude of the signal. Moreover, the amplitude limiting circuit clips the amplitude of the signal output from the variable attenuation circuit at the threshold voltage.

In other words, if the transmission loss of the transmission line is small, the variable attenuation circuit is activated, thereby improving the SN ratio for the noise superimposed on the transmission line, and if the transmission loss of the transmission line is large, the variable attenuation circuit is deactivated, thereby extending the dynamic range for enabling communication.

Therefore, a transmission system which is capable of improving the SN ratio for the noise superimposed on the transmission line and extending the dynamic range can be obtained.

Moreover, all of the amplitude comparison circuit, the variable attenuation circuit, and the amplitude limiting circuit are configured by analog circuits, and hence the application to an existing transmission system such as a general-purpose LAN can be easily realized by adding a simple circuit on a board.

Embodiment 2

Although the reference voltage $V_{ref}$ in the first embodiment described above is a predetermined value, the reference voltage $V_{ref}$ may be variably set in accordance with the minimum voltage level $V_{TH}$, which enables the communication. In this second embodiment, a transmission system which can control the reference voltage $V_{ref}$ to have an arbitrary value is described.

Figure 5:
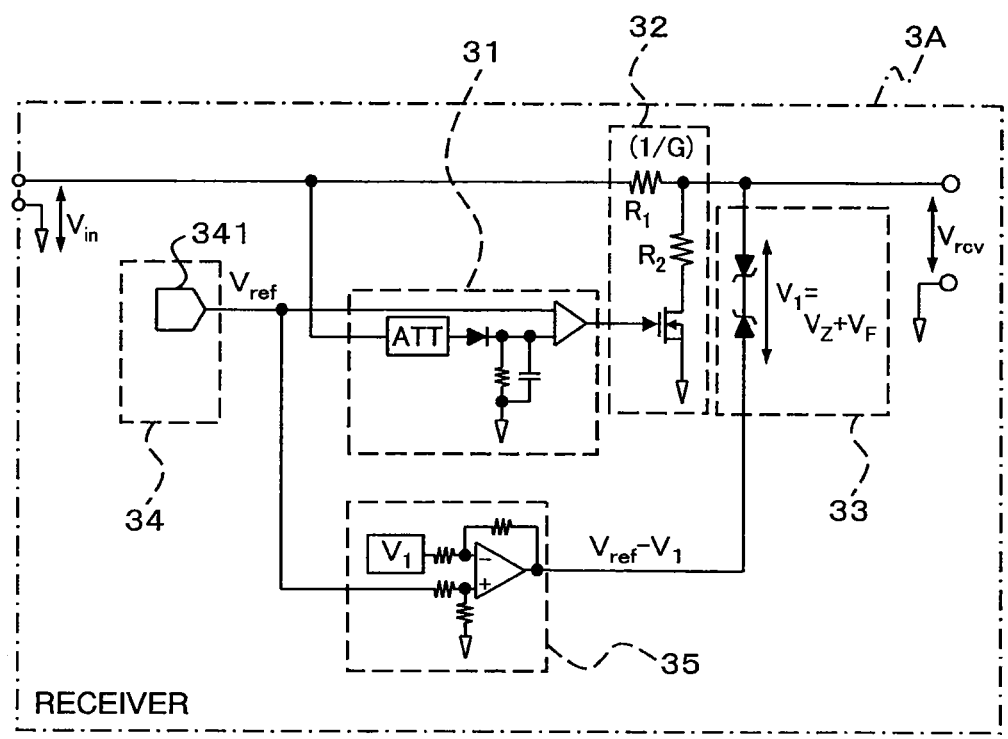
FIG. 5 A configuration diagram illustrating a receiver of a transmission system according to a second embodiment of the present invention.

FIG. 5 is a configuration diagram illustrating a receiver 3A of the transmission system according to the second embodiment of the present invention.

In FIG. 5, the receiver 3A includes a control circuit 34 and a subtraction circuit 35 in addition to the receiver 3 illustrated in FIG. 1.

The control circuit 34 outputs an arbitrary reference voltage $V_{ref}$ as an analog signal to the amplitude comparison circuit 31 and the subtraction circuit 35. The amplitude comparison circuit 31 attenuates the signal voltage $V_{in}$ of the input signal by G times, and compares the attenuated signal amplitude $V_{in}/G$ and the reference voltage $V_{ref}$ output as the analog signal from the control circuit 34.

The control circuit 34 includes a large scale integration (LSI) (not shown) and a D/A converter 341. The control circuit 34 takes in the signal amplitude $V_{rcv}$ of the received signal, variably sets the reference voltage $V_{ref}$ in accordance with the minimum voltage level $V_{TH}$ that enables the communication, and outputs the reference voltage $V_{ref}$ as the analog signal. It should be noted that the reference voltage $V_{ref}$ may be manually set.

The subtraction circuit 35 subtracts the threshold voltage (predetermined drop voltage) $V_1$ in the amplitude limiting circuit 33 from the reference voltage $V_{ref}$ output as the analog signal from the control circuit 34, and outputs a subtracted value ($V_{ref} - V_1$) to the output side of the amplitude limiting circuit 33 (the side opposite to the variable attenuation circuit 32). As a result, the maximum value of the signal amplitude $V_{rcv}$ of the received signal is clipped at the reference voltage $V_{ref}$.

It should be noted that the other configuration is the same as the first embodiment, and a description thereof is omitted.

The reference voltage $V_{ref}$ in the amplitude comparison circuit 31 and the threshold voltage $V_1$ in the amplitude limiting circuit 33 need to be set to a value slightly higher than the minimum voltage level $V_{TH}$ that enables communication.

In the transmission system according to the second embodiment of the present invention, the reference voltage $V_{ref}$ output from the control circuit 34 is changed, and hence the maximum value of the signal amplitude $V_{rcv}$ of the received signal, which is clipped by the amplitude limiting circuit 33, can be controlled arbitrarily. Therefore, the reference voltage $V_{ref}$ in the amplitude comparison circuit 31 can be properly set even for an interface circuit whose minimum voltage level $V_{TH}$ that enables communication is different.

As described above, according to the second embodiment, the control circuit outputs an arbitrary reference signal as an analog signal, and the subtraction circuit subtracts the drop voltage in the amplitude limiting circuit from the reference voltage output by the control circuit, and outputs the subtracted value to the output side of the amplitude limiting circuit.

As a result, the reference voltage can be variably set in accordance with the minimum voltage level that enables communication.

Figure 6:
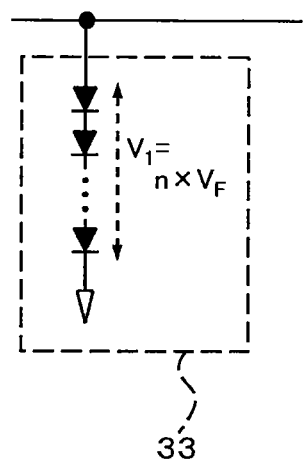
FIG. 6 A circuit diagram illustrating another amplitude limiting circuit according to the first and second embodiments of the present invention.
Figure 7:
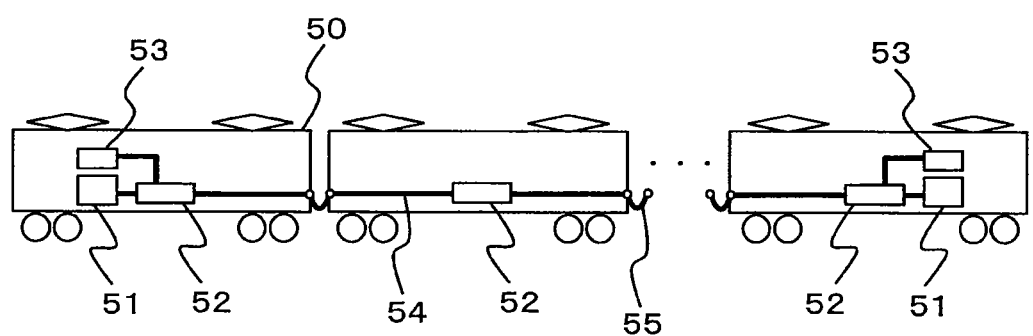
FIG. 7 A configuration diagram illustrating a conventional transmission system for railroad.

It should be noted that, in the first and second embodiments described above, the amplitude limiting circuit 33 is constructed by the two Zener diodes connected in the back-to-back configuration. However, the amplitude limiting circuit 33 is not limited to this configuration, and may be constructed by serially connecting n diodes whose forward drop voltage is $V_F$ as illustrated in FIG. 6.

Also in this case, the same effects as the first and second embodiments can be obtained.

REFERENCE SIGNS LIST 1 transmitter, 2 transmission line, 3 receiver, 11 transmission amplifier (amplification circuit), 31 amplitude comparison circuit, 32 variable attenuation circuit, 33 amplitude limiting circuit, 34 control circuit, 35 subtraction circuit

The invention claimed is:

1. A transmission system for transmitting a signal between a transmitter and a receiver, which are connected to each other via a transmission line, wherein:
   the transmitter includes an amplification circuit for stepping up an amplitude of an input signal; and
   the receiver includes:
      an amplitude comparison circuit for attenuating the amplitude of the signal, which is output from the amplification circuit and input via the transmission line, and comparing the attenuated amplitude and a reference voltage;
      a variable attenuation circuit for outputting, when the attenuated amplitude is larger than the reference voltage, the signal input to the receiver after attenuating the amplitude of the signal, and for outputting, when the attenuated amplitude is smaller than the reference voltage, the signal input to the receiver without attenuating the amplitude of the signal; and
      an amplitude limiting circuit for clipping the amplitude of the signal output from the variable attenuation circuit at a threshold voltage.

2. A transmission system according to claim 1, wherein the reference voltage and the threshold voltage are set to the same value.

3. A transmission system according to claim 1, wherein:
   the amplitude limiting circuit includes a diode element having a predetermined drop voltage; and
   the receiver further includes:
      a control circuit for outputting an arbitrary reference voltage as an analog signal; and
      a subtraction circuit for subtracting the predetermined drop voltage from the reference voltage output by the control circuit, and outputting a subtracted value to an output side of the amplitude limiting circuit.

* * * * *